US008895943B2

(12) United States Patent
De Boer et al.

(10) Patent No.: US 8,895,943 B2
(45) Date of Patent: Nov. 25, 2014

(54) LITHOGRAPHY SYSTEM AND METHOD OF PROCESSING SUBSTRATES IN SUCH A LITHOGRAPHY SYSTEM

(75) Inventors: Guido De Boer, Leerdam (NL); Hendrik Jan De Jong, Den Haag (NL); Vincent Sylvester Kuiper, Den Haag (NL); Erwin Slot, Zoetermeer (NL)

(73) Assignee: Mapper Lithography IP B.V., Delft (NL)

( * ) Notice: Subject to any disclaimer, the term of this patent is extended or adjusted under 35 U.S.C. 154(b) by 362 days.

(21) Appl. No.: 13/323,950

(22) Filed: Dec. 13, 2011

(65) Prior Publication Data

US 2012/0175527 A1  Jul. 12, 2012

Related U.S. Application Data

(60) Provisional application No. 61/422,745, filed on Dec. 14, 2010, provisional application No. 61/480,163, filed on Apr. 28, 2011.

(51) Int. Cl.
*H01L 21/677* (2006.01)
*G21K 5/00* (2006.01)
*G03F 7/20* (2006.01)
*H01J 37/18* (2006.01)
*H01J 37/16* (2006.01)

(52) U.S. Cl.
CPC ........... *G03F 7/70808* (2013.01); *H01J 37/185* (2013.01); *H01J 37/16* (2013.01); *G03F 7/70975* (2013.01); *G03F 7/708* (2013.01); *H01J 2237/31774* (2013.01)
USPC .................. 250/492.2; 250/492.1; 250/492.3

(58) Field of Classification Search
USPC ........ 250/453.11, 492.1, 492.2, 492.3, 507.1, 250/526; 359/1, 10, 11, 35; 355/53, 72, 77; 430/22, 394, 397
See application file for complete search history.

(56) References Cited

U.S. PATENT DOCUMENTS

| 6,261,853 | B1 * | 7/2001 | Howell et al. ................... 438/14 |
| 6,519,045 | B2 * | 2/2003 | Kwon ........................... 356/630 |
| 2004/0211924 | A1 | 10/2004 | Tanaka |
| 2007/0235665 | A1 * | 10/2007 | Shamoun et al. ........ 250/492.23 |
| 2008/0225261 | A1 * | 9/2008 | Hirayanagi ..................... 355/72 |
| 2008/0232933 | A1 * | 9/2008 | Kiley ............................. 414/217 |
| 2008/0232948 | A1 * | 9/2008 | van der Meulen et al. ... 414/805 |
| 2009/0081007 | A1 * | 3/2009 | Tabrizi et al. ............ 414/222.02 |
| 2009/0255362 | A1 * | 10/2009 | Barker et al. .............. 74/490.01 |
| 2009/0279088 | A1 * | 11/2009 | Fielden et al. ................ 356/364 |
| 2011/0049393 | A1 * | 3/2011 | De Boer et al. ............ 250/492.2 |
| 2013/0021593 | A1 * | 1/2013 | Onvlee et al. ................... 355/72 |
| 2013/0034421 | A1 * | 2/2013 | Kuiper et al. ................. 414/805 |
| 2013/0037730 | A1 * | 2/2013 | Slot et al. ................. 250/492.22 |
| 2013/0044305 | A1 * | 2/2013 | Kuiper et al. .................... 355/72 |
| 2013/0111485 | A1 * | 5/2013 | Van Kervinck et al. ...... 718/102 |

FOREIGN PATENT DOCUMENTS

JP        2000269299 A        9/2000

\* cited by examiner

*Primary Examiner* — Bernard E Souw
(74) *Attorney, Agent, or Firm* — Hoyng Monegier LLP; David P. Owen

(57) ABSTRACT

The invention relates to a lithography system comprising a plurality of lithography system units. Each lithography system unit comprises a lithography apparatus arranged in a vacuum chamber for patterning a substrate; a load lock system for transferring substrates into and out of the vacuum chamber; and a door for enabling entry into the vacuum chamber for servicing purposes. The load lock system and the door of each lithography system unit are provided at the same side and face a free area at a side of the lithography system, in particular the service area.

28 Claims, 7 Drawing Sheets

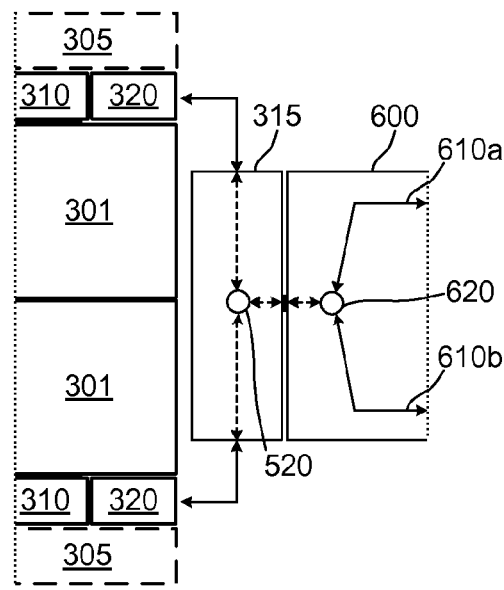 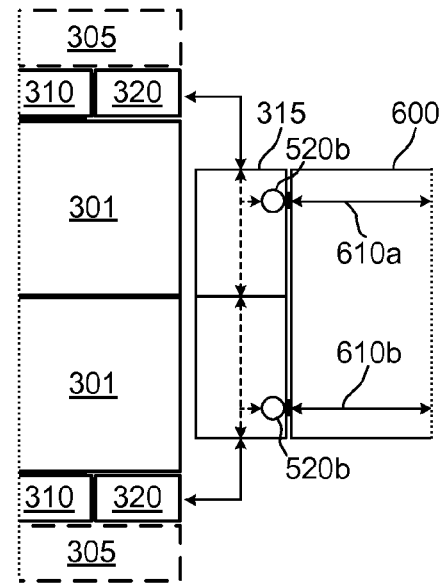
FIG 5a    FIG 5b
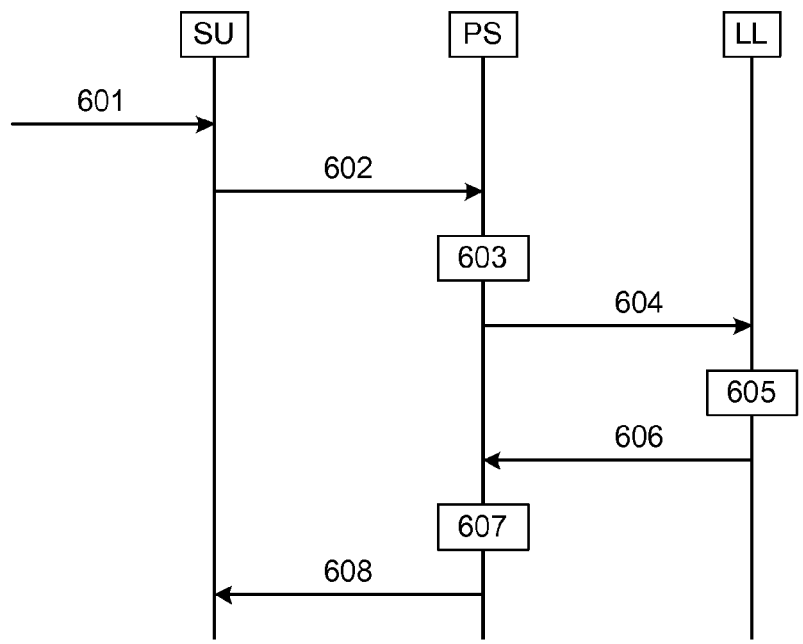
FIG 6

LITHOGRAPHY SYSTEM AND METHOD OF PROCESSING SUBSTRATES IN SUCH A LITHOGRAPHY SYSTEM

BACKGROUND OF THE INVENTION

1. Field of the Invention

The present invention generally relates to a lithography system comprising a plurality of lithography system units. The invention further relates to a method of handling substrates in such a lithography system.

2. Description of the Related Art

In the semiconductor industry, an ever increasing desire to manufacture smaller structures with high accuracy and reliability puts great demands on wafer processing technology. In particular, it is important to maximize wafer throughput of wafer processing equipment while maintaining the lowest capital costs and operational costs, and without excessive use of floor space. Floor space in a semiconductor manufacturing environment is expensive, as most space needs to meet high standard clean room conditions. Therefore, the floor space that is to be occupied by wafer processing equipment, i.e. the so-called footprint, is preferably as limited as possible. Furthermore, to ensure that clean room conditions can be maintained, wafer processing equipment is preferably serviced within the clean room.

A very critical step in the manufacturing of integrated circuits on a wafer is lithography. In a lithography process, a predetermined pattern is transferred onto a semiconductor substrate, often referred to as a wafer. Currently, the smallest dimensions of structures patterned with a lithography apparatus are about 70 nm in size. However, to produce even faster circuits structures of smaller size are desired.

Replacement of the current lithography systems by new systems capable of patterning with higher precision should not lead to a significant decrease in processing speed. Currently, a lithography apparatus patterns about 100 wafers per hour. Many newly developed lithography apparatuses, which can pattern smaller structures than currently possible, aim at a throughput of about 10 wafers per hour. Simple replacement of a present lithography apparatus by such new apparatus would thus reduce the throughput reduction of 10 times, which is often unacceptable.

It is desired that lithography apparatuses developed to achieve such smaller wafer patterns can be integrated in current clean rooms without major adjustments to the equipment used in the circuit manufacturing process. In other words, preferably newly developed higher resolution lithography apparatuses can replace the former lithography apparatuses without major adjustments in size, throughput and reliability.

BRIEF SUMMARY OF THE INVENTION

The present invention aims to provide a lithography system that meets the requirements set out above while permitting high throughput operation. In other words, the present invention provides a lithography system in which substrates can be handled and exposed both accurately and with sufficient throughput. Therefore, the invention provides a lithography system comprising a plurality of lithography system units, each lithography system unit comprising: a lithography apparatus, for example a charged particle lithography apparatus, arranged in a vacuum chamber for patterning a substrate; a load lock system for transferring substrates into and out of the vacuum chamber; and a door for enabling entry into the vacuum chamber for servicing purposes; wherein the load lock system and the door of each lithography system unit are provided at the same side and face a free area at a side of the lithography system. Due to the "outward" or "inside-out" orientation of the load lock systems and doors, the lithography system units, including the lithography apparatuses within the vacuum chambers, are directly accessible from an area free of equipment providing a service area for the lithography system. Direct access simplifies servicing of the lithography system, and may reduce the downtime of the system or parts thereof.

The lithography system units within the lithography system may be arranged back-to-back in two rows. The back-to-back layout of the lithography system units provides a lithography system with a limited "footprint". Floor space within a fab is valuable, and efficient use of the fab floor space is important.

The door may be removable connected to the vacuum chamber. A removably connected door enables easy and direct access to components within the vacuum chamber for servicing purposes. Easy access to these components can improve the servicing quality and may reduce the overall time needed for servicing. An easy way of removing the door would be to provide the door with one or more transfer elements, such as wheels or rails.

The load lock system may be integrated into the door. Integrating the load lock system and the door to form a single unit reduces the amount of material used to manufacture the lithography system unit. The use of less material reduces the costs. Furthermore, in case the door is removably connected, the door is easier to handle.

The lithography system unit may comprise a storage unit for temporary storage of substrates. The ability to temporarily store substrates enables the lithography system unit to continue operation in case of minor problems related to substrate supply and/or substrate processing in the lithography system unit.

The lithography system may comprise a preparation system for preparing substrates for patterning in a lithography apparatus. The preparation of the substrates within the lithography system unit guarantees a relatively short distance between the location of preparation and the location of patterning. This short distance reduces risks related to contamination and the like. To shorten this distance even further, preferably, each lithography system unit comprises a preparation system.

Transfer between the load lock system and the preparation system may be executed by means of a robot to reduce the risk of contamination even further.

The preparation unit may include a clamping unit for clamping a substrate on a substrate structure to form a clamp.

In some embodiments, the lithography system further comprises a substrate supply system for supplying substrates to the lithography system; and a substrate transfer system for transferring the substrates between the substrate supply system and the plurality of lithography system units. The use of a substrate supply system in combination with a substrate transfer system enables an effective installment of the lithography system in existing processing lines within a semiconductor manufacturing environment. To further automate the lithography system a robot may be used for transferring substrates between a transfer system and a preparation system.

The substrate supply system may be arranged to accommodate a substrate storage unit for temporary storage of substrates. The use of a substrate storage unit can reduce processing holdups within the lithography system due to temporary shortage of substrate supply and/or temporary lack of substrate removal of patterned substrates from the lithography system. The substrate storage unit may be a removable substrate storage unit, such as a front opening unified pod.

The substrate supply system may be connectable to a track system. Connecting the substrate supply system to a track system improves the integration of the lithography system in a processing line within a semiconductor manufacturing environment.

The substrate transfer system may be arranged above the lock systems of the lithography system units. Such positioning simplifies servicing of components within a lithography system unit without disturbing the operation of other lithography system units within the lithography system.

It will be evident that the presently invented principle may be put into practice in various ways.

BRIEF DESCRIPTION OF THE DRAWINGS

Various aspects of the invention will be further explained with reference to embodiments shown in the drawings wherein:

FIG. 2b schematically shows an assembly for removing and replacing a module in the lithography apparatus of FIG. 2a;

FIG. 3b schematically shows a cross-sectional side view of a portion of the lithography system of FIG. 3a;

FIG. 3c schematically shows a side view of another portion of the lithography system of FIG. 3a;

FIGS. 5a, 5b schematically show two different ways of coupling a substrate supply system to a track system;

FIG. 6 schematically shows an action flow of a method of processing a substrate in a lithography system unit.

DESCRIPTION OF ILLUSTRATIVE EMBODIMENTS

The following is a description of various embodiments of the invention, given by way of example only and with reference to the drawings.

Figure 1:
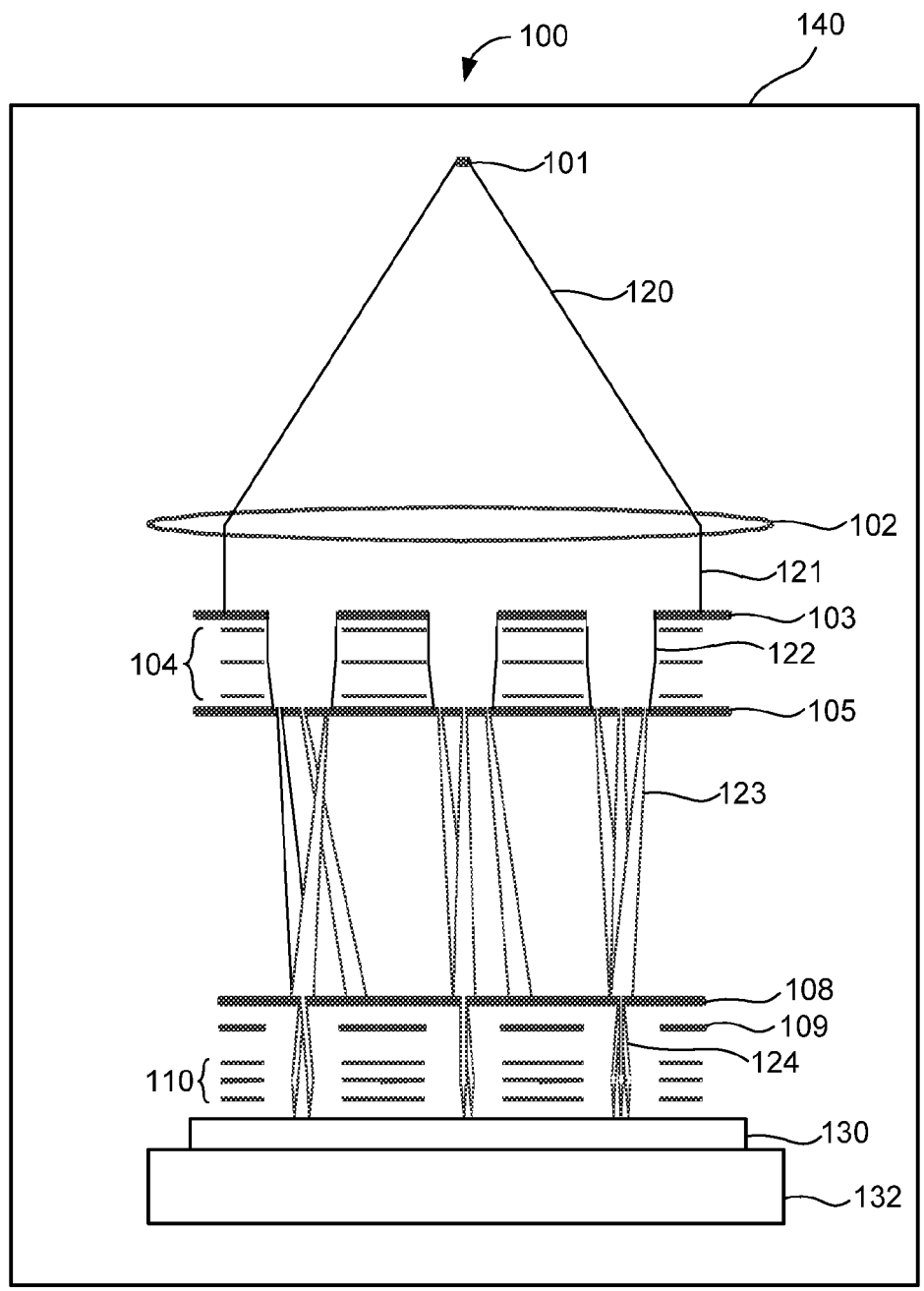
FIG. 1 is a simplified schematic drawing of an embodiment of a charged particle lithography apparatus.

FIG. 1 shows a simplified schematic drawing of an embodiment of a charged particle lithography apparatus 100. Such lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present invention and are all hereby incorporated by reference in their entirety.

In the embodiment shown in FIG. 1, the lithography apparatus 100 comprises an electron source 101 for producing an expanding electron beam 120. The expanding electron beam 120 is collimated by collimator lens system 102. The collimated electron beam 121 impinges on an aperture array 103, which blocks part of the beam to create a plurality of beamlets 122. The system generates a large number of beamlets 122, preferably about 10,000 to 1,000,000 beamlets.

The electron beamlets 122 pass through a condenser lens array 104 which focuses the electron beamlets 122 in the plane of a beam blanker array 105, comprising a plurality of blankers for deflecting one or more of the electron beamlets. The deflected and undeflected electron beamlets 123 arrive at beam stop array 108, which has a plurality of apertures. The beamlet blanker array 105 and beam stop array 108 operate together to block or let pass the beamlets 123. If beamlet blanker array 105 deflects a beamlet, it will not pass through the corresponding aperture in beam stop array 108, but instead will be blocked. But if beamlet blanker array 105 does not deflect a beamlet, then it will pass through the corresponding aperture in beam stop array 108, and through beam deflector array 109 and projection lens arrays 110.

Beam deflector array 109 provides for deflection of each beamlet 124 in the X and/or Y direction, substantially perpendicular to the direction of the undeflected beamlets, to scan the beamlets across the surface of target or substrate 130. Next, the beamlets 124 pass through projection lens arrays 110 and are projected onto substrate 130. The projection lens arrangement preferably provides a demagnification of about 100 to 500 times. The beamlets 124 impinge on the surface of substrate 130 positioned on moveable stage 132 for carrying the substrate. For lithography applications, the substrate usually comprises a wafer provided with a charged-particle sensitive layer or resist layer.

The charged particle lithography apparatus 100 operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber 140. All of the major elements of the lithography apparatus 100 are preferably housed in a common vacuum chamber, including the charged particle source, projector system for projecting the beamlets onto the substrate, and the moveable stage.

In an embodiment the charged particle source environment is differentially pumped to a considerably higher vacuum of up to $10^{-10}$ mbar. In such embodiment, the source may be located in a separate chamber, i.e. a source chamber. Pumping down the pressure level in the source chamber may be performed in the following way. First, the vacuum chamber and the source chamber are pumped down to the level of the vacuum chamber. Then the source chamber is additionally pumped to a desired lower pressure, preferably by means of a chemical getter in a manner known by a skilled person. By using a regenerative, chemical and so-called passive pump like a getter, the pressure level within the source chamber can be brought to a lower level than the pressure level in the vacuum chamber without the need of a vacuum turbo pump for this purpose. The use of a getter avoids the interior or immediate outside vicinity of the vacuum chamber being submitted to acoustical and/or mechanical vibrations as would be the case if a vacuum turbo pump or similar would be used for such a purpose.

Figure 2A:
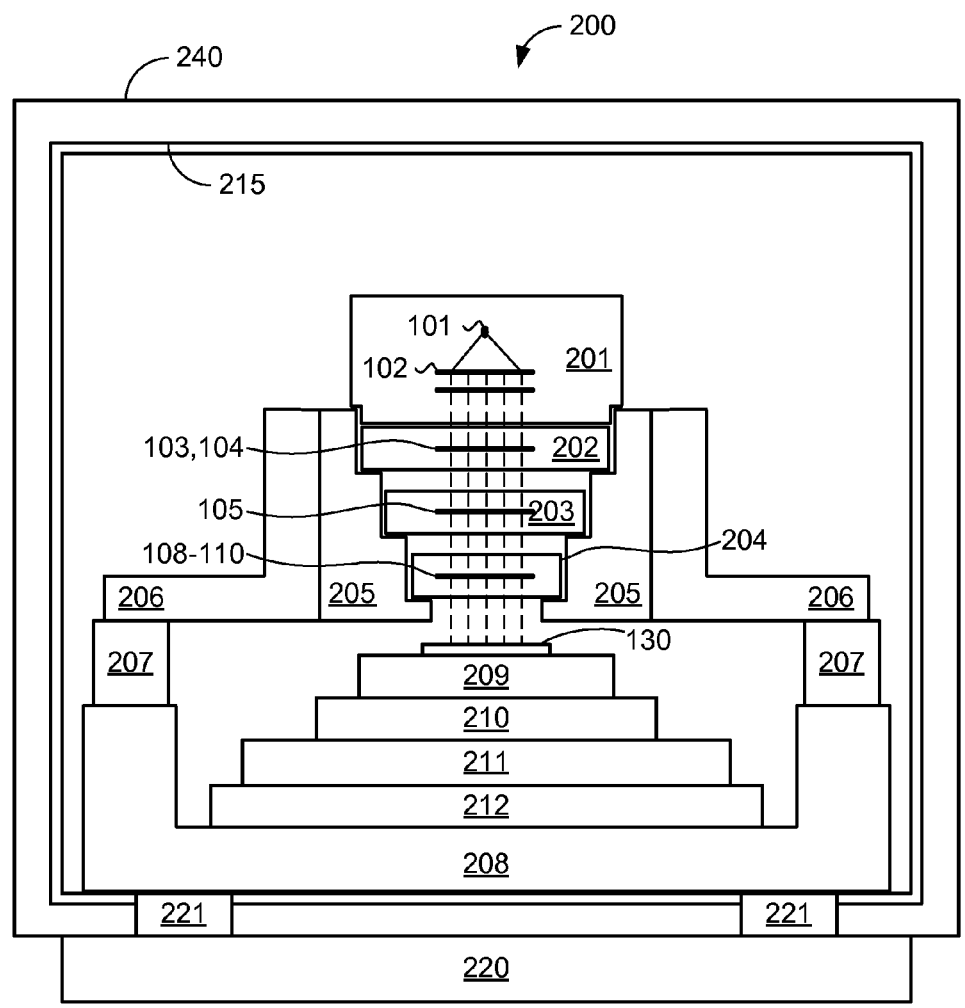
FIG. 2a is a simplified block diagram of a modular lithography apparatus.

FIG. 2a shows a simplified block diagram illustrating the principal elements of a modular lithography apparatus 200. The lithography apparatus 200 is preferably designed in a modular fashion to permit ease of maintenance. Major subsystems are preferably constructed in self-contained and removable modules, so that they can be removed from the lithography apparatus with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2a, these modular subsystems include an illumination optics module 201 including the charged particle beam source 101 and beam collimating system 102, an aperture array and condenser lens module 202 including aperture array 103 and condenser lens array 104, a beam switching module 203 including beamlet blanker array 105, and projection optics module 204 including beam stop array 108, beam deflector array 109, and projection lens arrays 110. The modules are designed to slide in and out from an alignment frame. In the embodiment shown in FIG. 2a, the alignment frame comprises an alignment inner subframe 205 and an alignment outer subframe 206. A frame 208 supports the alignment subframes 205 and 206 via vibration damping mounts 207. The substrate 130 rests on substrate support structure 209, which is in turn placed on a chuck 210. The chuck 210 sits on the stage short stroke 211 and long stroke 212. The lithography machine is enclosed in vacuum chamber 240, which may include a mu metal shielding layer or layers 215. The machine rests on base plate 220 supported by frame members 221.

Each module requires a large number of electrical signals and/or optical signals, and electrical power for its operation. The modules inside the vacuum chamber 240 receive these signals from control systems which are typically located outside of the chamber 240. The vacuum chamber 240 includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules.

Figure 2B:
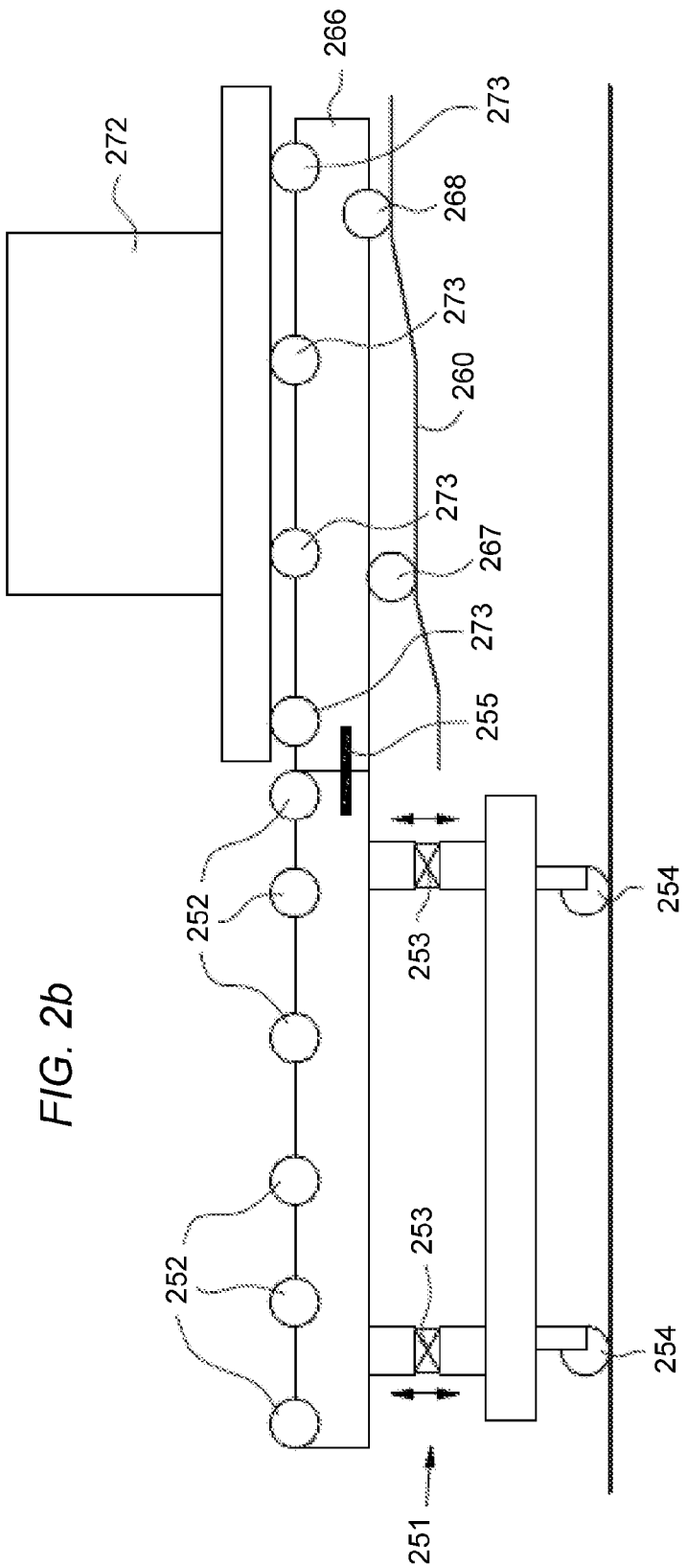

FIG. 2b schematically shows an assembly for removing and replacing a liftable module 272 in the lithography apparatus 200 of FIG. 2a in a relatively quick and easy way. For this purpose the assembly comprises a module support structure provided with a track 260 for guiding a body 266 provided with a first wheel 267 and a second wheel 268. The body 266 comprises guiding wheels 273 for guiding and supporting the module 272. The track comprises portions forming substantially horizontal plateaus connected by portions forming ramps. The wheels 267, 268 are positioned such that the body 266 can translate vertically without rotation movement while the body 266 follows the track 260 with the wheels 267, 268 remaining in contact with the track 260. When the body 260 advances over the track, it will translate both in the vertical direction as in the horizontal direction without any rotation. Consequently, a module 272 that is in contact with the body may be translated in a similar fashion.

The assembly of FIG. 2b further comprises a movable cart 251 comprising guiding wheels 252 for guiding and supporting the module 272. The movable cart may further comprise adjusters 253 for adjusting the position and/or the orientation of the guiding wheels. The cart 251 may be provided with wheels 254, enabling the cart to be moved towards and from the support of the module 272.

When the cart 251 is positioned near the liftable module, the position and/or the orientation of the guiding wheels 252 may be adjusted in order to align them with the guiding wheels 273 of the body. The cart 251 and the body 266 may be provided with a docking interface 255 in order to connect the cart 251 with the body 266. After the module 272 is lifted, it may be moved along the guiding wheels of both the body 266 and the cart 251 onto the cart 251. The module 272 may then be moved away, while being carried by the movable cart 251.

Figure 3A:
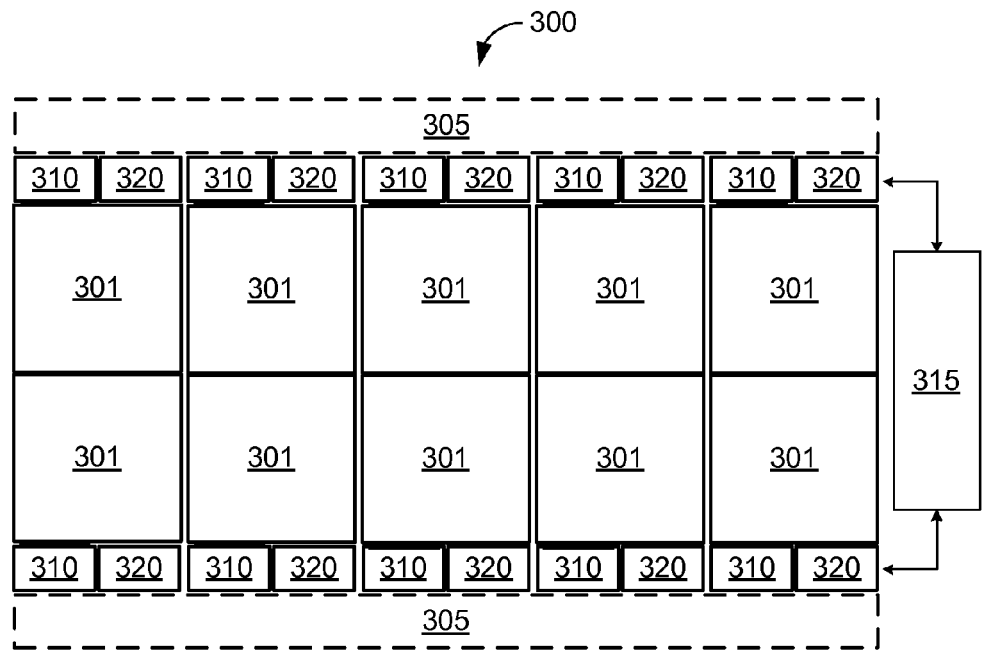
FIG. 3a shows a top view of a layout of lithography system according to an embodiment of the invention.
Figure 3B:
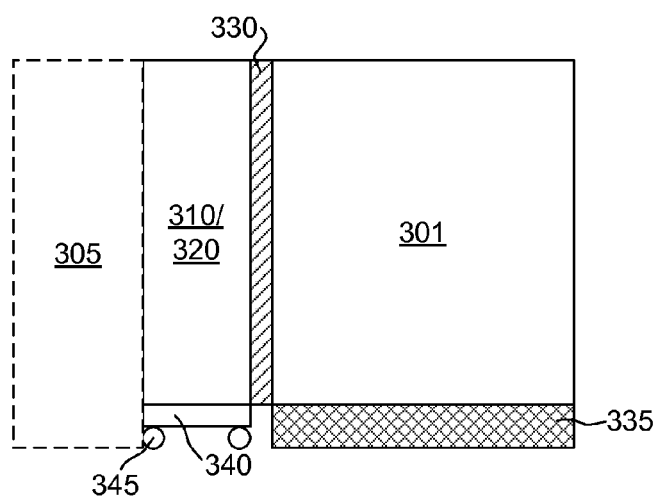

FIG. 3a shows a top view of a layout of lithography system 300 comprising a group of lithography system units according to an embodiment of the invention. Hereinafter, the layout may be referred to as lithography system 300 or cluster 300. FIG. 3b schematically shows a cross-sectional side view of a portion of the lithography system 300.

In this particular embodiment, the lithography system 300 comprises a group of ten lithography system units. The lithography system units are arranged back-to-back in two rows of five. Directly adjacent to the cluster 300, floor space is reserved as service area 305. Each lithography system unit comprises a lithography apparatus 301 that is contained in its own vacuum chamber, with one side of each vacuum chamber facing a lithography system unit in the other row, while the opposing side faces the surroundings of the cluster 300, in particular the service area 305.

In case of a charged particle lithography apparatus, the vacuum chamber preferably comprises all elements that enable lithography processing, including a charged particle source, a projector system for projecting charged particle beamlets onto a substrate to be patterned, and a moveable substrate stage. For example, the vacuum chamber may correspond to the chamber 240 discussed with reference to FIG. 2a.

The side of the lithography system unit facing a free area provided for service purposes comprises a load lock system 310 for transferring substrates into and out of the vacuum chamber, and also comprises an access door 330 that can be opened for such service purposes.

The lithography system units are provided with a door 330 at the same side as the load lock system 310. The door 330 may be removably attachable, and may be removable in its entirety, for example by using a transfer unit 340. The transfer unit 340 may be arranged to support the door 330 and may comprise one or more transfer elements 345, such as wheels or rails. The lithography apparatus 301 may be supported by a supporting structure 335 for positioning the lithography apparatus at an elevated position.

The free area at the side at which the load lock system and access door are located preferably is sufficiently large to accommodate the footprint of the door and the load lock. Furthermore, it is desirable that the free area is sufficiently large to accommodate a footprint of an arrangement for carrying components of the lithography apparatus. For example, in case a cart such as cart 251 in FIG. 2b is used for transfer of a module, the free area is preferably sufficiently large to enable transfer of the module on the cart towards and away from the lithography system units.

The lithography system 300 thus comprises a plurality of lithography system units having a load lock system 310 and a door 330 facing the surroundings, more in particular facing the service area 305 surrounding the lithography system 300. Due to the "outward" orientation of the load lock systems 310 and doors 330, the lithography system units, including the lithography apparatuses 301 within the vacuum chambers, are directly accessible from the service area 305. Direct access simplifies servicing of the lithography system 300, and may reduce the downtime of the lithography system or parts thereof. Opening a single specific vacuum chamber for servicing can be done without affecting the throughput of other lithographic system units within the lithography system 300.

The back-to-back layout of the lithography system units provides a lithography system 300 with a limited "footprint".

Floor space within a fab is valuable, and efficient use of the fab floor space is thus important.

The load lock system 310 may be integrated into the door 330. Integration of the load lock system 310 and the door 330 reduces the amount of material used in manufacturing the lithography system unit. A portion of the door 330 may be directly used as one of the side walls of the load lock system 310. The material reduction has the advantage that the door and load lock system combination is easier to handle during servicing. Furthermore, as less material is needed during manufacturing, the costs of manufacturing the lithography system are reduced as well.

The lithography system 300 further comprises a substrate supply system 315. The substrate supply system 315 is arranged to receive substrates to be processed by the lithography system 300, and to provide these substrates to the lithography system units for processing. This can effectively mean that the substrate supply system 315 provides the substrates to a preparation system 320 for pre-processing purposes. After patterning, the substrate supply system 315 may collect the patterned substrates. The use of a substrate supply system 315 enables the lithography system 300 to efficiently cooperate with other equipment in the fab as it allows for a relatively easy replacement of presently used lithography systems.

Figure 3C:
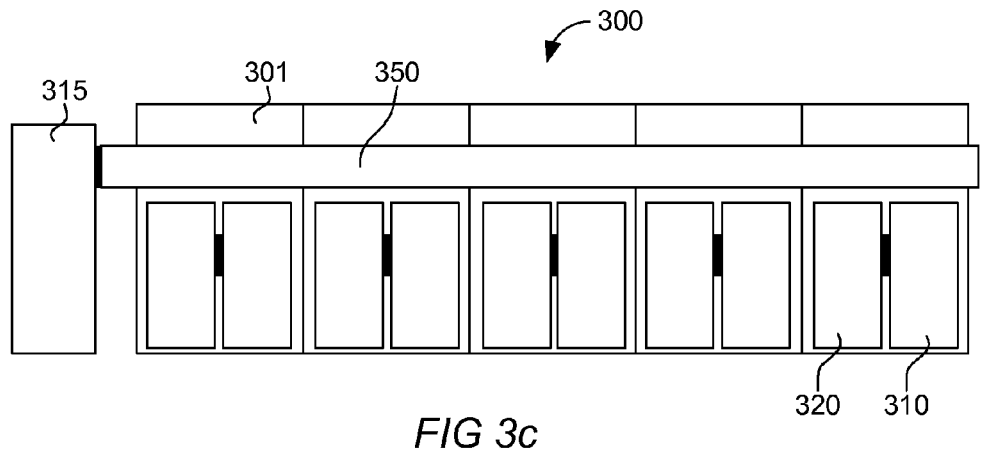

FIG. 3c schematically shows another side view of the lithography system 300 of FIG. 3a. In the shown embodiment, the lithography system 300 further comprises a substrate transfer system 350 for receiving substrates from and/or sending substrates to the substrate supply system 315. The substrate transfer system 350 may take the form of a suitable conveyor system, for example a conveyor system which extends in a substantially horizontal direction.

Preferably, the substrate transfer system 350 is designed not to interfere with the doors 330 of the lithography system units. This may be accomplished as shown in FIG. 3c. In this embodiment the substrate transfer system 350 extends in a substantially horizontal direction, and is arranged above the load lock systems 310, as well as the preparation units 320, of the lithography system units. As a result, the door of a single lithography system unit within the lithography system 300 may be opened for servicing purposes while the substrate transfer system 350 can continue with the transfer of substrates between the substrate supply system 315 and the other lithography system units within the lithography system 300.

The layout described with reference to FIGS. 3a-3c provides a cluster of lithography system units with limited complexity. The layout can be scaled rather easily. For example, if the lithography system 300 needs to operate with an 80% capacity, only eight out of the ten lithography system units need to be operational and/or installed.

Furthermore, the lithography system 300 can provide a reliable throughput. If one lithography system unit malfunctions and/or needs servicing, the other lithography system units within the cluster 300 may continue their operation. As a result, in case of 10 lithography system units with a throughput of 10 substrates per hour (wph), malfunctioning of one lithography system unit allows the cluster 300 to continue to work with a 90% efficiency. That is, it then operates with a throughput of 9×10 wph=90 wph instead of the ideal 100 wph. In comparison, a state of the art optical lithography apparatus may operate with a throughput of 100 wph. However, if some component within such optical lithography apparatus malfunctions, the entire apparatus needs to be shut down, reducing the throughput to 0 wph.

Before entry into the vacuum chamber, a substrate typically undergoes the actions of clamping, pre-alignment and pump down. In this context, clamping is defined as providing a substrate on a substrate support structure to form a single structure, hereafter referred to as "clamp". Furthermore, the term "clamped substrate" is used to refer to a substrate being clamped to a substrate support structure. Pre-alignment relates to aligning the substrate and/or clamp such that patterning can be performed onto a predetermined portion of the substrate in a certain orientation. Pump down relates to the step of reducing the pressure surrounding the substrate to minimize contamination and to reduce the influence of the substrate on the vacuum chamber pressure upon insertion into the lithography apparatus 301.

After the patterning action performed by the lithography apparatus 301, the substrate is typically exposed to a venting action, and an unclamping action, i.e. separating the substrate from the substrate support structure. In between the venting and unclamping actions, the substrate may be transferred.

The load lock system 310 forms an interface to a vacuum environment within the vacuum chamber. The system 310 is typically used for the pump down action and the venting action described above. For this purpose, the load lock system 310 comprises one or more chambers in which the pressure can be regulated. The load lock system 310 may comprise a single chamber suitable for both pump down and venting actions. Alternatively the system 310 comprises separate chambers for pump down and venting. For the pump down action the system 310 comprises pumps for pumping down the pressure within a chamber to a reduced pressure, e.g. a vacuum suitable for transfer of the clamped substrate and substrate support to the lithographic apparatus 301. For the venting action the load lock system 310 comprises vents for venting a chamber to increase the pressure after processing of the clamped substrate in the lithographic apparatus 301.

Clamping and/or unclamping may be performed in the preparation systems 320. Alternatively, the clamping may be performed at a different location prior to providing the substrate to the preparation systems 320, for example within the common supply system 315. In yet another alternative, clamping and/or unclamping may be performed within the load lock system 310.

Clamping and unclamping may be performed in separate units, but may also be executed in the same unit. Hereinafter the expression "clamping unit" refers to a unit for clamping and/or unclamping.

Figure 4A:
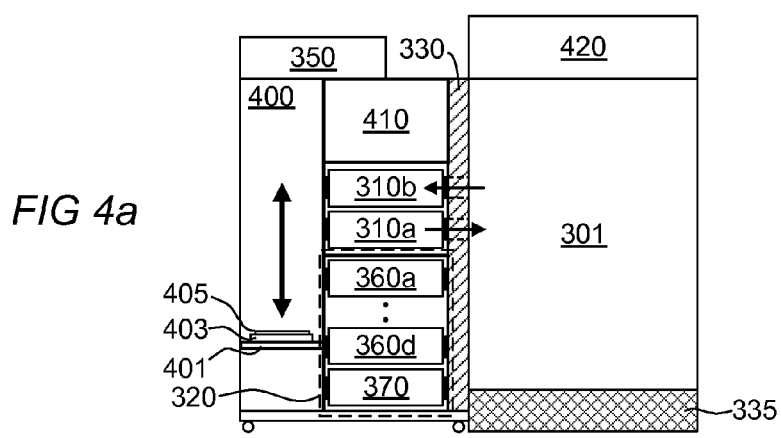
FIG. 4a schematically shows a lithography system unit according to an embodiment of the invention.

FIG. 4a schematically shows a lithography system unit provided with a first load lock chamber 310a for pump down, a second load lock chamber 310b for venting and a preparation system 320 that includes a number of clamping units 360a-d. In this embodiment, a clamp is formed in a suitable clamping unit 360a-d in the preparation system 320 and then inserted into the vacuum chamber via the first load lock chamber 310a. After patterning of the substrate by the lithography apparatus 301, the clamp is transferred back to a suitable clamping unit 360a-d in the preparation system 320 via the second load lock chamber 310b for unclamping.

In the embodiment of FIG. 4a the preparation system 320 further includes a pre-alignment unit 370 for pre-aligning the substrate before entry into the lithography apparatus 301 via the first load lock chamber 310a. Pre-alignment may be needed to ensure that the position and/or orientation of the substrate on the substrate support structure are suitable for accurate exposure within the lithography apparatus 301. Pre-alignment may be performed on an individual substrate before the substrate is clamped. However, in such case the clamping must be done in an extremely precise and coordinated way. Preferably, the substrate is pre-aligned while being clamped onto a substrate support structure. After pre-alignment in the pre-alignment unit 370 the substrate is provided to the first load lock chamber 310a for further processing.

A preparation system 320 may further comprise one or more additional units. For example, the preparation system 320 may include a conditioning unit for conditioning clamped substrates and/or unclamped substrates prior to exposure in the lithography apparatus 301. The conditioning unit may be arranged for thermal conditioning of a clamped or unclamped substrate by e.g. removing heat energy from the substrate (and substrate support structure) to improve the accuracy of lithographic patterning, as is known to persons skilled in the art.

Substrates and/or clamps may be transferred between different units by using a robot that operates within a robot space 400. In the exemplary embodiment of FIG. 4a the robot comprises a carrier 401 that can move in a substantially vertical direction. The carrier 401 is arranged for suitably transporting substrates and/or clamps between the load lock chambers 310a, 310b, the clamp units 360a-d, and the pre-alignment unit 370. In addition, the robot 401 may further be arranged to handle substrate exchange with the substrate transfer system 350.

A lithography system unit may further comprise a storage unit 410 for temporarily storing substrates. The stored substrate may be substrates that still need to be patterned by the lithography apparatus 301. Alternatively or additionally, the substrate storage unit 410 may be arranged to store patterned substrates awaiting transfer via the substrate transfer system 350. In the embodiment shown in FIG. 4a, the storage unit 410 is coupled to the substrate transfer system 350. Alternatively, or additionally, the storage unit 410 may be coupled to a replaceable unit and may take the form of a so-called front opening unified pod (FOUP). FOUPs enable relatively safe transfer of several substrates in one FOUP in a (clean room) environment. In yet another embodiment, the storage unit 410 is a replaceable unit, for example a FOUP.

Additionally, FIG. 4a schematically shows that electronics 420 needed to ensure proper operation of the lithography apparatus 420 may be placed on top of the lithography apparatus 301. Just like the embodiment shown in FIG. 3b, the door 330 can be removed together with the other components outside the vacuum chamber, for example by means of a transfer unit 340 comprising one or more transfer elements 345.

Figure 4B:
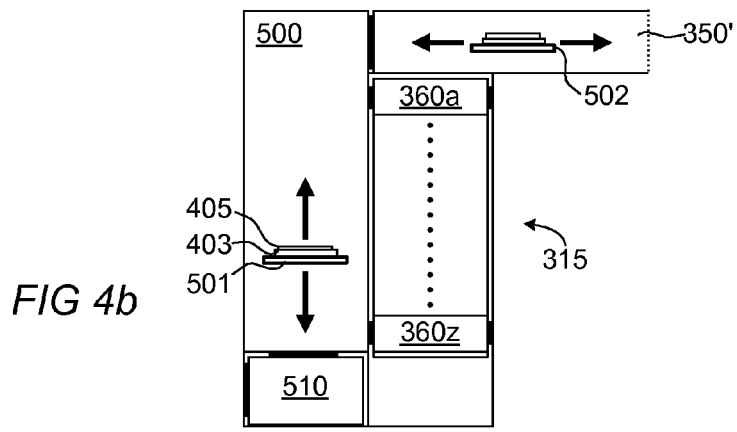
FIG. 4b schematically shows a substrate supply system according to an embodiment of the invention.

FIG. 4b schematically shows an embodiment in which the substrate supply system 315 comprises a number of clamping units 360a-360z substantially placed on top of each other. Additionally, the substrate supply system 315 is suitably connected to a clamped substrate or clamp transfer system 350'.

The substrate supply system 315 comprises a substrate handling robot that operates within a robot space 500. The robot is arranged for transporting substrates towards and away from the clamping unit 360a-360z. In the exemplary embodiment of FIG. 4b the robot comprises a carrier 501 that can move in a substantially vertical direction. In addition the carrier 501 may be able to move in a substantially horizontal direction as well, for example to enable an exchange of unclamped substrates via an interface with an external system such as a track system as will be discussed with reference to FIGS. 5a, 5b. Because the substrate supply system 315 is further suitably connected to the clamped substrate transfer system 350', the carrier 501 may also be arranged for transporting clamps between the clamping units 360a-360z and the clamp transfer system 350'.

Alternatively, or additionally, the substrate supply system 315 may be provided with a supply and/or storage unit 510 for the supply and/or storage of substrates. In case the substrate supply system 315 includes a storage unit 510, the carrier 501 is arranged to arrange transport of clamps and/or substrates to and from the storage unit 510. The storage unit 510 may not only be arranged to store unprocessed substrates prior to clamping, but may also be arranged to store patterned substrates, also referred to as exposed substrates, collected by the substrate supply system 315 after processing in a lithography apparatus in a lithography system unit. Central distribution and collection of substrates enables an efficient integration of the lithography cluster in a fab process line.

The supply and/or storage unit 510 may be a replaceable unit and may take the form of a so-called front opening unified pod (FOUP). FOUPs enable relatively safe transfer of several substrates in one FOUP in a (clean room) environment.

Although different components in FIGS. 4a, 4b are shown on top of each other, alternative embodiments in which one or more of the components are positioned adjacent to each other in a substantially horizontal direction are envisioned as well. Furthermore, additional support units to enable transfer of substrates between the carrier 501 and a clamping unit 360a-360z may be present.

In other embodiments of the lithography system, not shown in FIGS. 4a, 4b, clamping and/or unclamping is performed within the load lock system 310. Load lock systems 310 that are capable of executing these actions then need to be rather sophisticated in nature.

Clamping methods include but are not limited to clamping by using capillary forces, for example as described in US-patent application 2010/0265486 assigned to the owner of the present invention and hereby incorporated by reference in its entirety, clamping by applying a vacuum, clamping by freezing the substrate to the substrate support structure, and clamping by the use of electromagnetic forces. The type of clamping may depend on the type of subsequent processing to be used on the substrate.

A lithography system where the clamping and/or unclamping units are provided within the lithography system units, for example within a preparation system 320 as shown in FIG. 4a or within a load lock system 310, may be identified as a cluster 300 with a localized unclamped substrate supply, hereafter referred to as a localized cluster. In a localized cluster unclamped substrates are transported to an area in close proximity of the lithography apparatus 301 in which they are to be processed. Then, the substrates are clamped on a substrate support structure, and finally the clamps, i.e. substrates clamped onto a substrate support structure, are provided to the lithography apparatus 301.

A lithography system where the clamping and/or unclamping units are centrally provided, for example within the substrate supply system 315 as shown in FIG. 4b, may be referred to as a centralized cluster 300. In a centralized cluster unclamped substrates are clamped at a central location. The clamp is then transferred further into the cluster for further processing by the plurality of lithography apparatuses 301.

As can be readily recognized, the number of components within a centralized cluster may be lower than the number of components within a localized cluster, in particular in case the clamping and unclamping units 360 are shared by all lithography system units 301 within the cluster 300. On the other hand, localized clusters can be scaled relatively easy, as addition and/or removal of a lithography system unit merely means that, at most, adjustments have to be made to the substrate transfer system. Furthermore, in the case of a localized cluster the footprint of the substrate supply system 315 is generally smaller than the footprint of a centralized cluster, provided the clusters comprise the same number of lithography system units. Such footprint reduction is particularly achieved in case the number of lithography system units within the lithography system 300 is limited.

The load lock systems 310, as well as other units within the lithography system, for example one or more units in the preparation systems 320, such as pre-alignment units 370, clamping/unclamping units 360 and substrate storage systems 410 may comprise one or more valves for creating a controlled pressure environment. Keeping the substrates and/or clamps in a controlled pressure environment permits a reduced contamination environment to be maintained around the substrates. The controlled pressure environment may be an intermediate vacuum, between atmospheric pressure and the high vacuum of the lithography apparatus 301. This intermediate vacuum enables a reduction of contamination while avoiding having a large volume maintained at a high vacuum. In particular in case of not yet patterned substrates the intermediate vacuum aids in preparing the substrate for later processing in the vacuum environment of the lithography apparatus.

The substrate supply system 315 may be connected to other tools, such as a track system, in a semiconductor manufacturing environment for the exchange of substrates. FIGS. 5a, 5b schematically show two different ways of coupling a substrate supply system 315 to a track system 600.

In FIGS. 5a, 5b, the track system 600 comprises two track process lines 610a, 610b, denoted by solid arrows. In FIG. 5a the track system 600 is provided with a substrate handler 620 for receiving substrates from track process lines 610a, 610b and forwarding these substrates to the lithography system 300 for processing. In addition the substrate handler 620 is arranged for receiving patterned substrates from the lithography system 300 and forwarding these substrates to suitable process lines within the track, i.e. either track line 610a or 610b. The substrate supply system 315 comprises a substrate handler 520 for transferring substrates between the track system 600 and a substrate transfer system (denoted by dashed arrows). The substrate transfer between the substrate supply system 315 and the lithography system units is denoted by solid arrows. Such substrate transfer may be executed by any suitable substrate transfer system, for example the substrate transfer system 350 as depicted in and described with reference to FIGS. 3c and 4a or the clamp transfer system 350' as depicted in and described with reference to FIG. 4b. The substrate handler 520 within the substrate supply system 315 may take the form of a handler such as handler 501 as depicted in and described with reference to FIG. 4b.

In FIG. 5b, the track process lines 610a, 610b within the track system 600 are directly coupled to substrate supply system 315. The substrate supply system 315 now comprises two substrate handlers 520a, 520b, where the first substrate handler 520a is arranged to coordinate transfer between the track process line 610a and the lithography system, and the second substrate handler 520b is arranged to coordinate transfer between the track process line 610b and the lithography system. Both substrate handlers 520a, 520b may take the form of a robot, for example a robot comprising a carrier as described with reference to FIG. 4b. As shown in FIG. 5b, the substrate handlers 520a, 520b may further be arranged to coordinate substrate transfer within a portion of the substrate supply system 315.

FIG. 6 schematically shows an action flow of a method of processing a substrate in a lithography system unit. The lithography system unit comprises a storage unit SU, a preparation system PS and a load lock LL. The storage unit SU may for example comprise the storage unit 410 described above, the preparation system PS may for example comprise the preparation unit 320 described above, and the load lock LL may for example comprise the load lock system 310 described above. The load lock LL is connected to a lithography apparatus for exposing a pattern onto a target surface of a substrate to be exposed. Additionally, the lithography system unit comprises a substrate handling robot, such as a robot comprising and/or taking the form of carrier 401 in FIG. 4a, for transferring substrates between different components within the lithography system unit.

First, a substrate to be exposed is provided in action 601. Providing the substrate to the lithography system unit may be done using the combination of the substrate supply system 315 and substrate transfer system 350 shown in FIG. 3c. However, other ways of providing the substrate may be used as well. The substrate may be provided to the storage unit, as shown in FIG. 6, but may also be placed on the robot, for example at an interface between the lithography system unit and the external supply arrangement, for example a substrate transfer system.

In some embodiments where a storage unit is used, the substrate may be directed towards a predetermined orientation prior to further actions. This type of "coarse" alignment alleviates further alignment procedures because the substrates to be exposed enter the exposure method with roughly the same orientation.

The substrate is then transferred to a substrate preparation system PS in action 602 by the robot. Note that in case there is no storage unit SU, the robot does not pick up the substrate from the storage unit SU as shown in FIG. 6, but transfers the substrate to the preparation system PS after being provided with the substrate at an interface of the lithography system unit with an external supply arrangement.

In the preparation unit PS, the substrate is at least clamped to a substrate support structure in action 603. Additionally, other pre-conditioning actions such as (further) alignment, may take place, preferably before the clamping action.

The clamped substrate is then transferred by the robot to the load lock LL in action 604. The load lock LL is connected to the lithography apparatus, and the clamped substrate that is delivered by the robot accesses the lithography apparatus via the load lock LL. The clamped substrate is then exposed in the lithography apparatus in action 605.

After exposure, the substrate is transferred back to the load lock LL. The robot then transfers the exposed clamped substrate to the preparation system PS in action 606.

In the preparation system PS the exposed substrate is separated from the substrate support structure in action 607. Finally, the separated exposed substrate is transferred by the robot to a point for removal from the lithography system unit in action 608. This point may be located in the storage unit SU, as schematically depicted in FIG. 6. However, this point for removal may also be located at an interface of the lithography system unit with an external supply arrangement.

Figure 7:
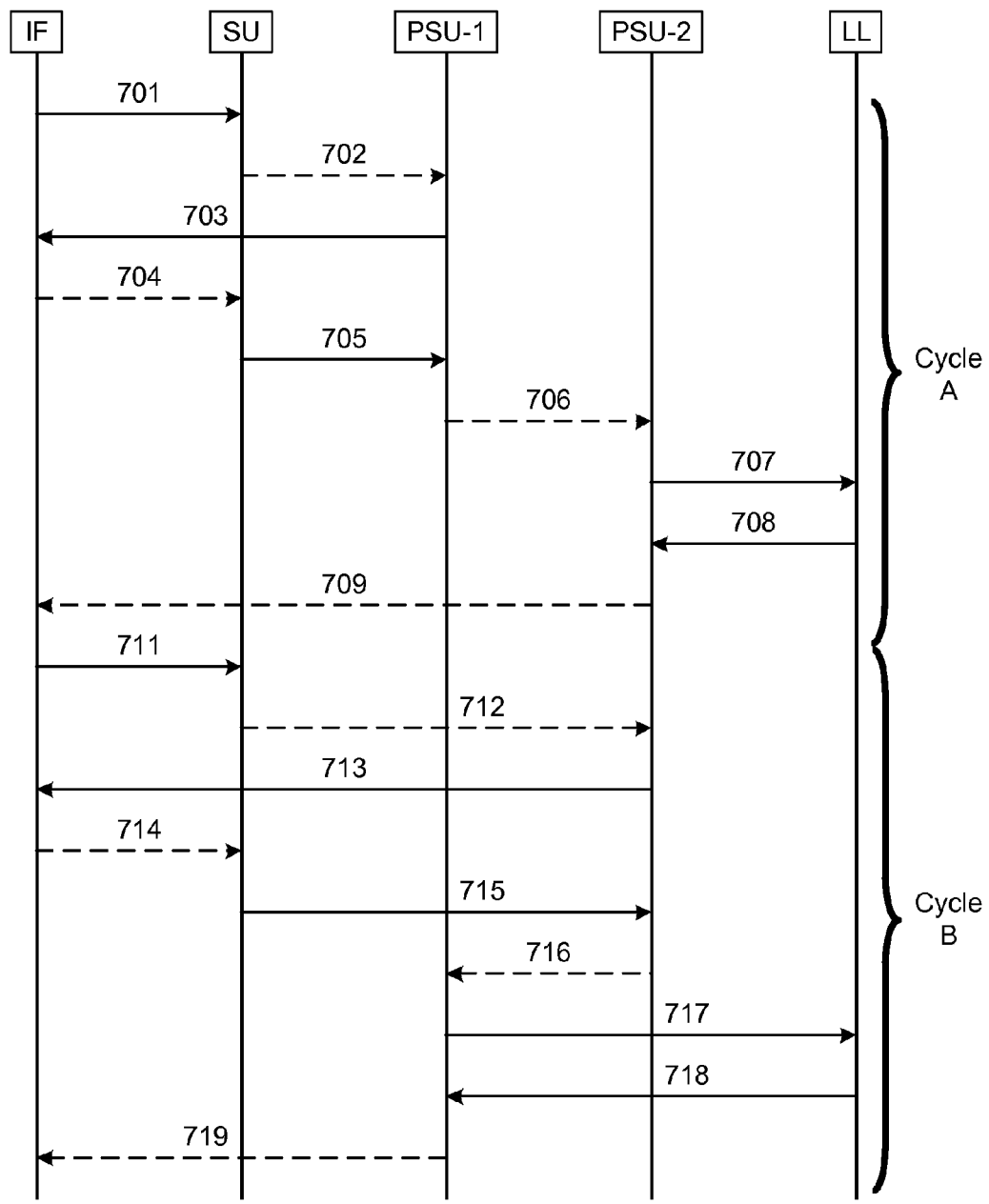
FIG. 7 schematically shows an exemplary trajectory of a substrate handling robot in a lithography system unit.

FIG. 7 schematically shows another action flow for processing a substrate in a lithography system unit. Transfer of the substrate may be accomplished using a substrate handling robot, FIG. 7 illustrating the trajectory of the robot for making the sequence of transfers. The robot may comprise and/or take the form of a carrier such as carrier 401 in FIG. 4a. In FIG. 7, the interface between the substrate transfer system and the robot is denoted by "IF". Furthermore, the exemplary lithography system unit comprises a storage unit SU, a first preparation system unit PSU-1, a second preparation system unit PSU-2, and a load-lock LL coupled to a lithography apparatus. The interface IF may for example comprise the interface between the substrate transfer system 350 and the lithography system unit described above, the storage unit SU may for example comprise the storage unit 410 described above, the preparation units PSU-1 and PSU-2 may for example comprise two of the clamp units 360 described above, and the load lock LL may for example comprise the load lock system 310 described above. Movements during which the robot actually transfers a substrate are represented by the solid arrows. Mere movements of the robot without substrate transfer are denoted by the dashed arrows.

The trajectory in FIG. 7 starts with the robot being positioned at the interface IF. The first movement involves the transfer of a new unclamped substrate to be exposed from the interface IF towards the storage unit SU for temporary storage in action 701. After placement of the substrate in the storage unit SU, the robot moves towards the first preparation system unit PSU-1 in action 702. At preparation system unit PSU-1, the robot picks up an exposed unclamped substrate and transfers this substrate in action 703 to the interface IF to allow removal thereof from the lithography system unit. The robot then moves back in action 704 to storage unit SU to pick up the unclamped substrate for exposure placed therein at the end of action 701. In action 705, the unclamped substrate is picked up from the storage unit SU and transferred to the preparation system unit PSU-1. After placement of the unclamped substrate in the PSU-1, the robot moves in action 706 to the preparation system unit PSU-2. The robot then picks up a clamped substrate to be exposed and transfers the clamped substrate to the load lock LL for exposure in the lithography apparatus in action 707. After removal of the clamped substrate at the load lock, the robot picks up an exposed clamped substrate and transfers this substrate to preparation system unit PSU-2 for unclamping in action 708. Finally, the robot moves to the interface IF without carrying a substrate in action 709. The series of actions 701-709 is referred to as "cycle A".

The trajectory in FIG. 7 then continues at the interface IF with action 711, which is similar to action 701. However, after placement of the new unclamped substrate to be exposed, the robot does not move to preparation system unit PSU-1 as in action 702, but instead moves to preparation system unit PSU-2 in action 712. Subsequently, in action 713, the robot picks up an exposed clamped substrate present in preparation system unit PSU-2, and transfers this substrate to the interface IF to enable removal of the substrate from the lithography system unit. The robot then moves to the storage unit SU in action 714 in a similar fashion as it did in action 704. The robot then picks up an unclamped substrate to be exposed from the storage unit SU and transfers this substrate to the preparation system unit PSU-2 in action 715. After delivery of this unclamped substrate, the robot moves to the preparation system unit PSU-1 in action 716, picks up a clamped substrate to be exposed and transfers the clamped substrate to the load lock LL for exposure in the lithography apparatus in action 717. After removal of the clamped substrate at the load lock, the robot picks up an exposed clamped substrate and transfers this substrate to preparation system unit PSU-1 for unclamping in action 718. Finally, the robot moves to the interface IF without carrying a substrate in action 719. The series of actions 711-719 is referred to as "cycle B".

The robot may now repeat the trajectory of FIG. 7, which effectively means that it alternates between following cycle A and cycle B, where the difference between the two cycles is the role of the preparation system unit PSU-1 and the preparation system unit PSU-2. The trajectory shown in FIG. 7 is particularly useful to ensure a continuous flow of substrates in case the clamping action in a preparation system unit takes more time than the duration of an entire cycle.

Although some embodiments of the invention have been described with reference to a lithography system comprising ten lithography system units, the number of lithography system units within a lithography system may vary. For example, instead of ten lithography system units, any other number of lithography system units above one may be used.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A lithography system comprising a plurality of lithography system units, each lithography system unit comprising:
   a vacuum chamber;
   a lithography apparatus arranged in the vacuum chamber for patterning a substrate;
   a load lock system for transferring substrates into and out of the vacuum chamber; and
   a door for enabling entry into the vacuum chamber for servicing purposes;
   wherein the load lock system and the door of each lithography system unit are provided at the same side of the lithography system unit and face a free area at a side of the lithography system.

2. The system of claim 1, wherein the lithography system units are arranged back-to-back in two rows.

3. The system of claim 1, wherein the door is removably connected to the vacuum chamber.

4. The system of claim 3, wherein the door is provided with one or more transfer elements.

5. The system of claim 1, wherein the load lock system is integrated into the door.

6. The system of claim 1, wherein the lithography system unit comprises a storage unit for temporary storage of substrates.

7. The system of claim 1, further comprising a preparation system for preparing substrates for patterning in a lithography apparatus.

8. The system of claim 1 preceding the immediately preceding claim, wherein each lithography system unit comprises a preparation system.

9. The system of claim 8, wherein a lithography system unit comprises a robot for transferring substrates between the preparation system and the load lock system.

10. The system of claim 7, wherein the preparation system comprises a clamping unit for clamping a substrate on a substrate support structure to form a clamp.

11. The system of claim 1, further comprising:
    a substrate supply system for enabling supply of substrates to the plurality of lithography system units; and
    a substrate transfer system for transferring the substrates between the substrate supply system and the plurality of lithography system units.

12. The system of claim 11, wherein each lithography system unit comprises a preparation system, and a robot for transferring substrates between the substrate transfer system and the preparation system.

13. The system of claim 11, wherein the substrate supply system is arranged to accommodate a substrate storage unit for temporary storage of substrates.

14. The system of claim 13, wherein the substrate storage unit is a removable substrate storage unit, such as a front opening unified pod, FOUP.

15. The system of claim 11, wherein the substrate supply system is connectable to a track system.

16. The system of claim 11, wherein the substrate transfer system is arranged above the load lock systems of the lithography system units.

17. The system of claim 1, wherein the lithography apparatus is a charged particle lithography apparatus.

18. A method of processing a substrate in a lithography system unit of a lithography system according to claim 1, the lithography system unit further comprising a substrate preparation system, and a substrate handling robot for transferring substrates between the load lock system and the substrate preparation system, wherein the method comprises:
providing a substrate to be exposed;
transferring the substrate by means of the robot to the substrate preparation system;
clamping the substrate on a substrate support structure in the substrate preparation system;
transferring the clamped substrate by means of the robot to the load lock system for exposure by the lithography apparatus;
exposing the clamped substrate in a vacuum environment by the lithography apparatus;
transferring the exposed clamped substrate by means of the robot from the load lock system to the substrate preparation system;
separating the exposed substrate from the substrate support structure in the substrate preparation system; and
transferring the exposed substrate by means of the robot to a point for removal from the lithography system unit.

19. The method of claim 18, further comprising, before the clamping, aligning the substrate with respect to the substrate support structure in the substrate preparation system.

20. The method of claim 18, wherein the lithography system unit further comprises a substrate storage unit for storing one of one or more substrates, and wherein the substrates to be exposed are provided to the substrate storage unit.

21. The method of claim 20, wherein the substrate storage unit is further arranged for storing one or more exposed substrates, and wherein transferring the exposed substrate to the point for removal comprises transferring the exposed substrate by means of the robot to the substrate storage unit.

22. The method of claim 18, wherein the method further comprises directing the substrate towards a predetermined orientation prior to transfer to the substrate preparation unit.

23. The method of claim 18, wherein the substrate preparation system comprises a first substrate preparation unit and a second substrate preparation unit, the first and second preparation units being arranged for clamping a substrate to be exposed onto a substrate support structure and separating an exposed substrate from a substrate support structure, wherein the robot transfers the substrates to and from the first and second preparation units in an alternating fashion.

24. The method of claim 18, wherein the lithography system further comprises a substrate supply system comprising an input for receiving substrates to be exposed and an output for providing exposed substrates, and a substrate transfer system for transferring substrates between the substrate supply system and the lithography system units, and wherein providing the substrate to be exposed comprises transferring the substrate to be exposed from the input of the substrate supply system to the lithography system unit by means of the substrate transfer system.

25. The method of claim 24, wherein the method further comprises removing the exposed substrate from the lithography system by transferring the exposed substrate from the lithography system unit to the output of the substrate supply system by means of the substrate transfer system.

26. A lithography system unit comprising:
a vacuum chamber;
a lithography apparatus arranged in the vacuum chamber for patterning a substrate; and
a door for enabling entry into the vacuum chamber for servicing purposes;
wherein the door of the lithography system unit faces a free area at a side of the lithography system unit, and
wherein the door is provided with one or more components for handling the substrate.

27. The lithography system unit of claim 1, wherein the door is provided with a load lock system for transferring substrates into and out of the vacuum chamber.

28. A lithography system comprising a plurality of lithography system units according to claim 26.